United States Patent [19]

Chang

[11] 4,076,575

[45] Feb. 28, 1978

[54] INTEGRATED FABRICATION METHOD OF FORMING CONNECTORS THROUGH INSULATIVE LAYERS

[75] Inventor: Kenneth Chang, Hopewell Junction, N.Y.

[73] Assignee: International Business Machines Corporation, Armonk, N.Y.

[21] Appl. No.: 701,451

[22] Filed: Jun. 30, 1976

[51] Int. Cl.$^2$ .................. H01L 21/312; B44C 1/22
[52] U.S. Cl. .................. 156/656; 156/643; 156/657; 156/659; 156/662; 156/901; 96/36.2; 427/96; 427/99; 427/259; 29/625; 204/192 E; 204/192 EC
[58] Field of Search ............... 427/96, 99, 259; 156/8, 156/17, 659, 657, 901, 630, 631, 632, 633, 634, 643, 656, 653, 662; 96/36.2; 29/578, 625; 204/192 E, 192 EC

[56] References Cited

U.S. PATENT DOCUMENTS

| | | | |
|---|---|---|---|
| 3,451,867 | 6/1969 | Taft | 427/259 |
| 3,597,834 | 8/1971 | Lathrop | 29/576 |
| 3,633,269 | 1/1972 | Bachmeier | 29/589 |
| 3,697,318 | 10/1972 | Feinberg | 156/17 |
| 3,714,521 | 1/1973 | Shaw | 357/71 |
| 3,831,068 | 8/1974 | Kniepkamp | 357/71 |
| 3,837,907 | 9/1974 | Berglund | 156/17 |
| 3,877,051 | 4/1975 | Calhoun | 357/15 |

*Primary Examiner*—Michael F. Esposito
*Attorney, Agent, or Firm*—J. B. Kraft

[57] ABSTRACT

In integrated circuit fabrication, a method is provided for forming metallic connectors through a layer of electrically insulative material. The method comprises forming a layer of electrically insulative material on a substrate and then forming a mask of photoresist material having a plurality of openings through which said insulative layer is exposed on said insulative layer. Then, the exposed portions of said insulative layer are removed by etching to form openings through which the underlying substrate is exposed, after which a first metal layer is deposited over the masked substrate. This metal layer is thinner than the insulative layer so that the openings in the insulative layer are only filled part way up with metal. Then, the photoresist mask is removed thereby removing the metal layer deposited on it to leave only the metal in the insulative layer openings. Next, a second layer of metal is deposited over the first insulative layer and over the remaining metal in said openings, after which portions of the second metal layer over the insulative layer are removed to form a metallization pattern which is continuous with the metal in said openings.

15 Claims, 11 Drawing Figures

INTEGRATED FABRICATION METHOD OF FORMING CONNECTORS THROUGH INSULATIVE LAYERS

CROSS-REFERENCED TO RELATED PATENT APPLICATION

Ser. No. 701,068, Title: An Etching Process Utilizing the Same Positive Photoresist Layer for Two Etching Steps, Inventors: Kenneth Chang et al, Filed: June 30, 1976.

BACKGROUND OF THE INVENTION

With the ever-increasing circuit density in integrated circuits, demands on the multilevel metallurgy necessary to connect the individual circuits in the integrated circuit have been more demanding. Because of space limitations, particularly in lateral dimensions, there have been requirements that the via holes through the insulative layers separating different layers of metallurgy have smaller and smaller lateral dimensions relative to the vertical dimensions of such holes. Of course, the vertical dimensions of such via holes remain limited by the thickness of the insulative layer which is required to thoroughly electrically insulate one level of metallurgy from another. We have found, that with insulative layers having thicknesses of two microns or greater and with metallurgies deposited on such insulative layers which are thinner than the insulative layer, there is a problem of discontinuity of the metal deposited in the via holes.

In order to illustrate this prior art problem, reference is made to FIGS. 1A and 1B of the drawings. In such a typical prior art structure substrate 10 has formed thereon an insulative layer 11 which serves to insulate the substrate from the first layer of metallurgy or the first level metallurgical pattern 12. Conventional contact openings, which need not be shown for purposes of illustrating the present invention, extend through insulative layer 11 connecting various active regions, i.e., N- or P-type regions, formed in the semiconductor or silicon substrate 10 to the first level of metallurgy 12. A second layer of insulative material 13 covers metallurgy layer 12 and insulates metallurgy layer 12 from a second level of metallurgy which will be formed on the surface of insulative layer 13. In order to interconnect metallurgy layer 12 to this second level of metallurgy, it is necessary to have via holes 14 which are selectively positioned to interconnect metallurgy layer 12 with the upper layer of metallurgy. Conventionally, it has been the practice to deposit the second layer of metallurgy 15 as a blanket deposition in a single step so that layer 15 will, as shown in FIG. 1B, deposit on the surface of insulative layer 13 as well as in via holes 14. With relatively deep via holes such as those required to penetrate through insulative layers such as layer 13 having thicknesses in the order of two microns, if the metallurgy being deposited in the blanket deposition has a thickness of less than two microns, e.g., conventional integrated circuit metallurgies have thicknesses in the order of from 1 to 1.3 microns, discontinuities such as discontinuities 16 shown in FIG. 1B tend to occur interfering with the continuity of the conductive path from the metal in the via hole to the remainder of the metallization pattern which is subsequently formed from blanket metal layer 15 in the conventional manner.

SUMMARY OF THE INVENTION

Accordingly, it is a primary object of this invention to provide a method for forming via hole contacts through relatively deep via holes which are free from discontinuities in the conductive path from the contacts to the upper metallization pattern.

It is another object of the present invention to provide for a method of forming conductive contacts in apertures through an insulative layer which contacts provide a continuous conductive path from a layer of metallization formed on the upper surface of said insulative layer through the insulative layer to the surface on which said insulative layer is formed.

In accordance with the present invention, there is provided a method for forming metallic connectors or contacts through a layer of electrically insulative material together with the metallization pattern on said insulative layer for interconnecting such connectors which comprises forming the layer of insulative layer on the substrate and then forming on said insulative layer a mask of photoresist material having a plurality of openings through which the insulative layer is exposed. Next, the exposed insulative layer is selectively etched to form insulative layer openings through which the underlying substrate is exposed. Then, a first layer of metal is deposited over this substrate. This metal layer is preferably thinner than the insulative layer whereby the insulative layer openings are partially filled with metal. The photoresist mask is then removed to thereby remove the metal layer deposited on the photoresist with only the metal deposited in the insulative layer openings remaining, after which a second layer of metal is deposited over the structure and thus lies over the first insulative layer and in contact with the metal remaining in the openings. Since the openings are already partially filled with metal when the second layer of metal is deposited, the openings are no longer as deep as they were initially and the problem of discontinuity peculiar to the relatively deep openings does not occur. Finally, portions of the second metal layer over the insulative layer are selectively removed to form the desired metallization pattern which is continuous with the portions of this second layer of metallization deposited in said openings. The result is contacts or connectors through the openings in the insulative layer which are conductively continuous with said metallization pattern.

In accordance with a more particular aspect of the present invention, with particularly deep apertures through insulative layers, a two-step process may be utilized wherein the insulative layer which is to separate the metallization pattern from the underlying substrate surface is applied in two steps. By this approach, the above described method is followed until the removal of the photoresist mask method is followed until the removal of the photoresist mask to leave only the metal deposited in the openings through the insulative layer. Then, before depositing the second layer of metal, another layer of insulative material is deposited over the entire structure thus increasing the thickness of the insulative material, after which a plurality of openings are formed through the second insulative layer respectively in registration with the openings already formed in the first insulative layer to thereby expose the metal remaining in the first layer openings. At this point, the previously described procedure is resumed and the second layer of metal deposited over the second insulative layer and in the openings through both layers to contact the metal remaining exposed in said openings. By this approach, it is possible by a proper apportionment of the thicknesses of both layers, particularly using the second insulative layer which is thinner than the first insulative layer, to form a contact or connector through a hole, e.g., via hole, which is relatively deep but which is free from discontinuities because the deposition of metal in each of the two steps is not into a hole so deep that discontinuities would tend to occur.

The foregoing and other objects, features and advantages of the invention will be apparent from the following more particular description of the preferred embodiments of the invention, as illustrated in the accompanying drawings.

DESCRIPTION OF THE PREFERRED EMBODIMENTS

Figure 1A:
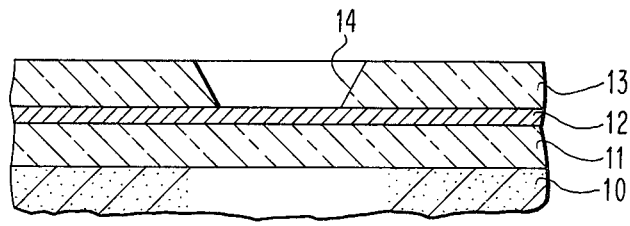
FIGS. 1A and 1B are diagrammatic cross-sectional views of an integrated circuit structure both before and after a metal deposition step shown to illustrate a prior art problem.
Figure 1B:
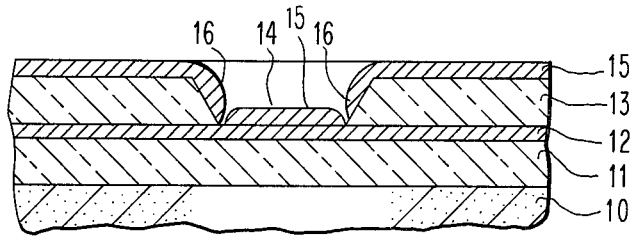

FIGS. 1A and 1B have already been discussed in the Background of Invention section of this specification in order to illustrate the discontinuity problems encountered in the prior art. There will now be described a procedure for forming metallization in via holes or contact holes through relatively deep or thick insulative layers which are substantially free from problems of discontinuity.

Figure 2:
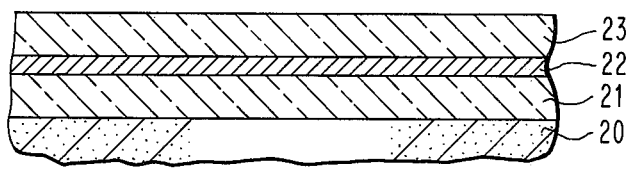
FIGS. 2 – 6 and — 8A are diagrammatic cross-sectional views of an integrated circuit structure during the fabrication in accordance with the preferred embodiments of the present invention.

With reference first to FIG. 2, let us assume that the starting structure comprises an integrated circuit substrate 20 which has P- and N-type regions providing the active and passive regions of the integrated circuit and a similar structure to any conventional integrated circuit substrate described, for example, in U.S. Pat. No. 3,539,876. The active and passive regions in substrate 20 have not been shown because they are not significant to the illustration of the present invention. Substrate 20 is covered with a conventional passivating insulative layer 21 which may be of any of the conventional materials, e.g., silicon dioxide, silicon nitride or a composite of silicon nitride over silicon dioxide. It should be noted, that the structures being described, unless otherwise indicated, are conventional integrated circuit structures which may be fabricated by methods known in the integrated circuit art, e.g., the methods described in U.S. Pat. No. 3,539,876. For purposes of the present description, layer 21 will be considered to be a composite of a bottom layer of silicon dioxide 1000 A in thickness covered with a layer of silicon nitride 1600 A in thickness. A first level metallization pattern 22 is formed over the surface of passivation layer 21. This metallization pattern which has a thickness in the order of 0.85 microns may be any conventional metal used in integrated circuit connections. In the present embodiment, it is preferably an aluminum alloy containing some copper and some silicon. However, any conventional integrated circuit metallurgy including chromium, copper, or alloys thereof may be used. The metallic layer may be deposited by any conventional technique such as those described in U.S. Pat. No. 3,539,876. The deposition may be, for example, vapor deposition or RF sputter deposition. Metallization layer 22 is, of course, in the form of a metallization pattern in conventional integrated circuits which is connected to various regions in the substrate by contacts passing through passivation layer 21. These have not been shown because it would not aid in the illustration of the present invention which will be described with respect to forming openings through insulative layer 23. This insulative layer has a thickness in the order of two microns or more and may be formed by any of the conventional deposition techniques described in U.S. Pat. No. 3,539,876, for example, by the chemical vapor deposition methods described therein as well as the cathode sputtering or RF sputtering methods described. While this layer may be of such conventional materials as silicon nitride, aluminum oxide or silicon dioxide as well as composites thereof, for purposes of the present invention we will consider the layer to be a layer of RF sputter deposited silicon dioxide.

Figure 3:
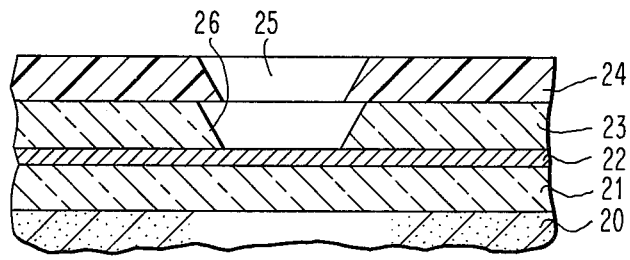

Next, FIG. 3, a layer of photoresist 24, 23,000 A in thickness is formed on the surface of insulative layer 23 and a photoresist mask is formed in the conventional manner with openings 25 only one of which is shown for illustrative purposes. These openings form a pattern which corresponds to the via holes to be subsequently formed. The photoresist mask 24 may be formed using any conventional photolithographic technique standard in the integrated circuit art as described in U.S. Pat. No. 3,539,876. The photoresist mask may be formed from a conventional negative photoresist such as KTFR. KTFR is distributed by Kodak Corporation and is a cyclized rubber composition containing a photosensitive cross-linking agent. Instead of KTFR, any other conventional photoresist may be applied by spinning. A standard photoresist which may be used comprises a novolak-type phenolformaldehyde resin and a photosensitive cross-linking agent. The latter is representative of a positive type photoresist. Other positive photoresists which may be used are those described in U.S. Pat. Nos. 3,201,239, 3,046,120 or 3,666,473.

The photoresist is then used as a mask 24 for etching corresponding openings 26 through insulative layer 23 to expose the underlying metallization pattern 22. In order to form openings 26, any conventional technique may be employed for etching the silicon dioxide such as those described in U.S. Pat. No. 3,539,876. The standard etchant which may be used is buffered HF. Alternatively, instead of chemical etching openings 26 may be formed in layer 23 by sputter etching, utilizing conventional sputter etching apparatus and methods such as those described in U.S. Pat. No. 3,598,710, particularly sputter etching carried out utilizing reactive gases such as oxygen or hydrogen. U.S. Pat. No. 3,471,396 sets forth a listing of inert or reactive gases or combinations thereof which may be used in sputter etching. An effective RF sputter etching system for etching openings in insulative materials is an RF sputter etching system described in the above-mentioned patent utilizing an oxygen atmosphere.

Figure 4:
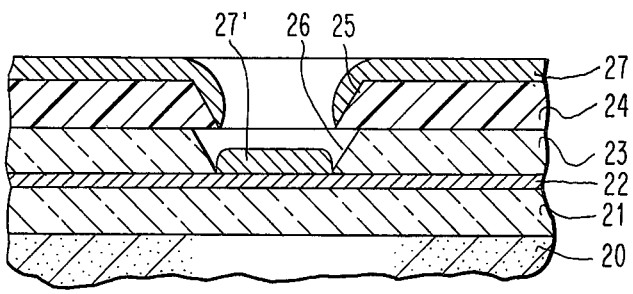

After apertures 26 have been formed, it is preferable that the structure be heated at a temperature in the order of 150° C for about 1 hour in order to toughen photoresist layer 24 for the subsequent metal deposition step shown in FIG. 4. Next, FIG. 4, a layer of metal 27 about 1.2 – 1.4 microns in thickness is deposited over the structure using conventional metal deposition techniques as described above with substrate temperatures in the order of 100° C. The metal used for this metallization layer 27 is preferably the same as that used for metallization pattern 22 as previously described. In addition to the metal deposited on the surface of photoresist layer 24, a portion of the metal 27' will deposit and partially fill opening 26.

Figure 5:
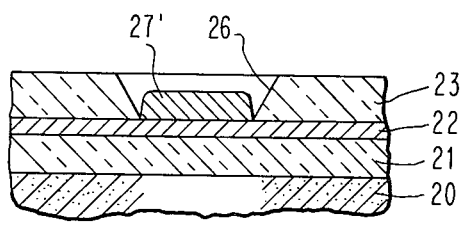
Figure 6:
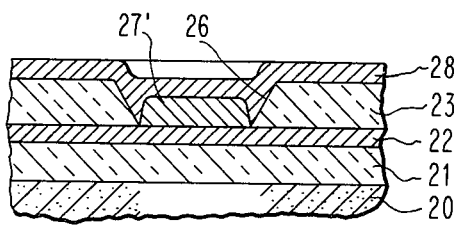

Next, following conventional "lift-off" techniques, photoresist mask 24 is removed, the "lift-off" carrying with it all portions of metal layer 27 except those portions 27' deposited in openings 26 to produce the structure shown in FIG. 5. In this connection, it should be noted that "lift-off" techniques are well-known in the art. U.S. Pat. No. 3,873,361 gives a good state of the art picture of "lift-off" techniques. In accordance with such conventional "lift-off" techniques, layers 24 and 27 may be removed by immersing the structure of FIG. 4 in a conventional photoresist solvent. Conventional photoresist solvents which may be used in such "lift-off" techniques are set forth in U.S. pat. No. 3,873,361 commencing at column 5, line 45. However, for best results, it is preferable that the "lift-off" be carried out by pressing a contact adhesive tape such as Scotch Tape* against metal layer 27 and peeling off layer 27 together with some of the photoresist followed by the removal of any remaining portions of photoresist mask 24 by standard photoresist removal solvents and techniques.
*Trademark of 3M Corporation Next, a layer of metal 28 having about the same thickness as the previously deposited layer of metal and preferably of the same composition is deposited over the entire structure in a blanket deposition. Metallic layer 28 extends over the surface of insulative layer 23 and into contact openings 26 where it contacts layer 27' which partially fills the via hole opening. Since the via hole opening 26 is partially filled with metal, the upper portion which has to be filled by layer 28 is not as deep as openings 14 in the prior art structure as shown in FIGS. 1A and 1B. Consequently, the prior art problem of discontinuities does not occur. Metallic layer 28 is then patterned into a metallization pattern which will integrate or interconnect the plurality of contacts such as that provided in via hole 26. Such a metallization pattern may be formed in any conventional manner such as those described in U.S. Pat. No. 3,539,876. From this point, the integrated circuit may be further insulated and have contact pads formed thereto following the conventional prior art procedures as described in U.S. Pat. No. 3,539,876.

Figure 5A:
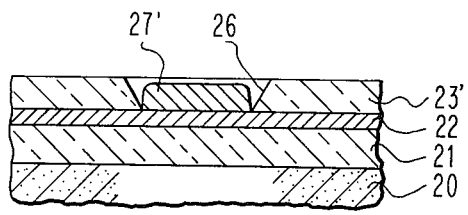
Figure 6A:
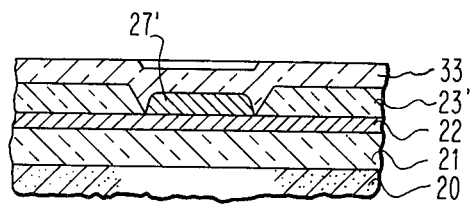
Figure 7A:
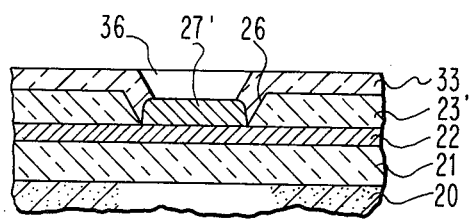
Figure 8A:
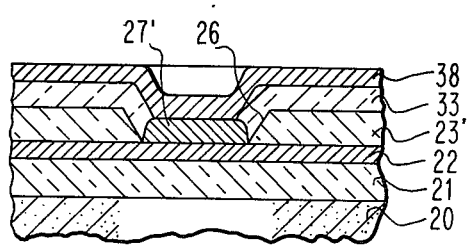

With relatively deep via holes, i.e., where the insulative layer is required to be in the order of 2.3 – 2.5 microns in thickness or greater the method of the present invention provides an approach wherein the insulative layer may be deposited in two steps. In such two-step method, a procedure previously described with respect to FIGS. 2 – 5 remains substantially the same except that the insulative layer deposited initially, i.e., insulative layer 23', is thinner than the insulative layer 23 deposited in the one-step approach. This technique will be described with respect to steps FIGS. 5A – 8A. With reference to FIG. 5A, we are at the same stage as we were with respect to FIG. 5 except that insulative layer 23' is thinner, i.e., in the order of 1.5 microns so that metal layer 27' deposited in via hole opening 26 which is about 1.2 microns in thickness almost completely fills opening 26. Then, FIG. 6A, using the same deposition steps previously described for the deposition of insulative layer 23, the second insulative layer 33 preferably of the same material as layer 23 is deposited over the structure as shown. Next, FIG. 7A, utilizing conventional photolithographic etching techniques such as those described in U.S. Pat. No. 3,539,876, an opening 36 is formed through layer 33 in registration with deposited metal layer 27' which remains in opening 26. In order to facilitate the registration of opening 36 with respect to metal layer 27', opening 36 preferably has narrower lateral dimensions than opening 26. Then, in a final step which uses substantially the equivalent of the step of FIG. 6A, metallic layer 38 which is of the same composition as metallic layer 28 is deposited in a blanket deposition such as that previously described with respect to metallic layer 28. After which metallic layer 38, as previously described with respect to metallic layer 28, is patterned into the selected metallization pattern.

While the present invention has been described with respect to the formation of via holes and connectors in said via holes through an insulative layer to a metallization pattern which underlies this insulative layer, it should be understood to those skilled in the art that this method may also be used in the formation of contact openings through an insulative layer formed directly on the surface of a semiconductor material such as silicon. Ordinarily, insulative layers formed directly on the surface of a semiconductor body which are used for passivation need not be as thick as insulative layers used to separate two levels of metallization, and, consequently, could have contact openings therethrough formed by conventional prior art techniques. However, should it be desirable to utilize thicker layers of insulative material directly on the surface of a semiconductor substrate, the present approach may be used for the formation of contacts through such thicker insulative layer.

While the invention has been particularly shown and described with reference to the preferred embodiments thereof, it will be understood by those skilled in the art that various changes in forma and details may be made therein without departing from the spirit and scope of the invention.

What is claimed is:

1. In integrated circuit fabrication, a method of forming metallic connectors through a layer of electrically insulative material and a metallization pattern for connecting such connectors on said layer comprising forming a layer of electrically insulative material on a substrate, forming on said insultative layer, a mask of photoresist material having a plurality of openings through which said insulative layer is exposed, etching to selectively remove the exposed insulative layer to form insulative layer openings through which the underlying substrate is exposed, depositing a first layer of metal over the masked substrate, said metal layer being thinner than said insulative layer whereby said insulative layer openings are partially filled with metal, removing said photoresist mask to thereby remove the metal layer deposited on said photoresist with only the metal deposited in said insulative layer openings remaining, depositing a second layer of metal over said first insulative layer and the metal remaining in said openings, and selectively removing portions of said second metal layer over said insulative layer to form said metallization pattern connected to the metal remaining in said openings.

2. The method of claim 1 wherein said etching is chemical etching.

3. The method of claim 1 wherein said etching step is carried out by RF sputter etching.

4. The method of claim 3 wherein said RF sputter etching utilizes reactive ions.

5. The method of claim 1 wherein said photoresist mask is removed by the steps of
   applying a sheet having a contact adhesive surface to said first layer of metal, and
   removing said sheet to selectively remove those portions of said second metal layer over said photoresist together with said photoresist.

6. The method of claim 5 wherein said sheet is adhesive-coated tape.

7. The method of claim 1 wherein said initial substrate on which said insulative layer is formed comprises metallization on a substrate insulative layer on the surface of a semiconductor member.

8. In integrated circuit fabrication, a method of forming metallic connectors through a layer of electrically insulative material and a metallization pattern for connecting such connectors on said layer comprising
   forming a first layer of electrically insulative material on a substrate,
   forming on said first insulative layer, a mask of photoresist material having a plurality of openings through which said insulative layer is exposed,
   etching to selectively remove the exposed insulative layer to form insulative layer openings through which the underlying substrate is exposed,
   depositing a first layer of metal over the masked substrate said metal layer being thinner than said insulative layer whereby said insulative layer openings are partially filled with metal,
   removing said phototresist mask to thereby remove the metal layer deposited on said photoresist with only the metal deposited in said insulative layer openings remaining,
   forming a second layer of electrically inslulative material over said first insulative layer and remaining metal,
   forming a plurality of openings through said second insulative layer respectively in registration with said openings in said first insulative layer to expose the metal remaining in said first layer openings,
   depositing a second layer of metal over said second insulative layer and said remaining metal exposed in said second insulative layer openings, and
   selectively removing portions of said second metal layer over said second insulative layer to form said metallization pattern connected to the remaining metal exposed in said second insulative layer openings.

9. The method of claim 8 wherein said etching is chemical etching.

10. The method of claim 8 wherein said photoresist mask is removed by the steps of
    applying a sheet having a contact adhesive surface to said first layer of metal, and
    removing said sheet to selectively remove those portions of said second metal layer over said photoresist.

11. The method of claim 10 wherein said sheet is adhesive-coated tape.

12. The method of claim 8 wherein the openings through said second insulative layer have smaller lateral dimensions than the openings through said first insulative layer, thereby facilitating registration.

13. The method of claim 8 wherein said second insulative layer is thicker than said first insulative layer.

14. The method of claim 8 wherein the openings through said second insulative layer are formed by etching through a photoresist mask.

15. The method of claim 8 wherein said initial substrate on which said first insulative layer is formed comprises metallization on a substrate insulative layer on the surface of a semiconductor member.

* * * * *